(12) United States Patent
Son

(10) Patent No.: US 12,622,106 B2
(45) Date of Patent: May 5, 2026

(54) LIGHT EMITTING DISPLAY APPARATUS AND METHOD OF MANUFACTURING THE SAME

(71) Applicant: LG Display Co., Ltd., Seoul (KR)

(72) Inventor: YoungHoon Son, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 443 days.

(21) Appl. No.: 18/127,381

(22) Filed: Mar. 28, 2023

(65) Prior Publication Data

US 2023/0317884 A1 Oct. 5, 2023

(30) Foreign Application Priority Data

Mar. 29, 2022 (KR) ........................ 10-2022-0039021
Jun. 17, 2022 (KR) ........................ 10-2022-0073994

(51) Int. Cl.
| | |
|---|---|
| *H10H 20/831* | (2025.01) |
| *H10H 20/816* | (2025.01) |
| *H10W 90/00* | (2026.01) |
| *H10H 20/01* | (2025.01) |

(52) U.S. Cl.
CPC ...... *H10H 20/8312* (2025.01); *H10H 20/816* (2025.01); *H10W 90/00* (2026.01); *H10H 20/032* (2025.01)

(58) Field of Classification Search
CPC ............. H10H 20/8312; H10H 20/816; H10H 20/032; H01L 25/0753
See application file for complete search history.

(56) References Cited

FOREIGN PATENT DOCUMENTS

| | | | |
|---|---|---|---|
| KR | 10-2019-0068814 A | 6/2019 |
| KR | 10-2020-0069729 A | 6/2020 |
| KR | 10-2020-0137847 A | 12/2020 |
| KR | 10-2021-0084878 A | 7/2021 |

*Primary Examiner* — Samuel A Gebremariam

(74) *Attorney, Agent, or Firm* — Birch, Stewart, Kolasch & Birch, LLP

(57) ABSTRACT

A light emitting display apparatus in which a charge generating layer is separated between pixels, and a method using the same are discussed. The light emitting display apparatus can include a first anode and a second anode provided on a substrate, a bank provided on the first anode and the second anode and including at least one opening portion at which the first anode and the second anode are exposed, a first light emitting unit including a first main light emitting unit provided on the first anode, a first charge generating layer provided in an upper surface of the first main light emitting unit and in an upper surface of a bank exposed between the first anode and the second anode, an additional light emitting layer covering the first charge generating layer, and a cathode covering the additional light emitting layer.

17 Claims, 9 Drawing Sheets

FIG. 3

LIGHT EMITTING DISPLAY APPARATUS AND METHOD OF MANUFACTURING THE SAME

CROSS-REFERENCE TO RELATED APPLICATIONS

This application claims priority to the Korean Patent Application No. 10-2022-0039021 filed on Mar. 29, 2022 in the Republic of Korea and the Korean Patent Application No. 10-2022-0073994 filed on Jun. 17, 2022 in the Republic of Korea, the entire contents of all these applications being hereby expressly incorporated by reference into the present application.

BACKGROUND

Field of the Invention

The present disclosure relates to a light emitting display apparatus and a method of manufacturing the same.

Discussion of the Related Art

A light emitting display apparatus is a display apparatus, which emits light by using a light emitting device, and includes a light emitting display panel including light emitting devices.

As a resolution of the light emitting display panel increases progressively, undesired light can be emitted due to a leakage current between adjacent pixels.

The emission of undesired light which may be caused by a leakage current between adjacent pixels can occur due to a light emitting layer continuously provided in adjacent pixels.

Particularly, in a light emitting display panel which includes light emitting devices including a plurality of emission units, a leakage current can be generated by a charge generating layer CGL continuously provided in adjacent pixels.

SUMMARY OF THE DISCLOSURE

Accordingly, the present disclosure is directed to providing a light emitting display apparatus and method of manufacturing the same that substantially obviates one or more problems due to limitations and disadvantages of the related art.

An aspect of the present disclosure is directed to providing a light emitting display apparatus, in which charge generating layer is separated between pixels, and a method using the same.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a first anode and a second anode provided on a substrate, the first anode provided in a first pixel and the second anode provided in a second pixel, a bank provided on the first anode and the second anode, and including at least one opening portion at which the first anode and the second anode are exposed, a first light emitting unit including a first main light emitting unit provided on the first anode, a first charge generating layer provided in an upper surface of the first main light emitting unit and in an upper surface of a bank exposed between the first anode and the second anode, an additional light emitting layer covering the first charge generating layer, and a cathode covering the additional light emitting layer, wherein the first charge generating layer comprises a first main charge generating layer provided in an upper surface of the first main light emitting unit and a first sub charge generating layer provided in an upper surface of the bank, and the first main charge generating layer is separated from the first sub charge generating layer at an end of the first main light emitting unit.

In another aspect of the present disclosure, there is provided a method of manufacturing a light emitting display apparatus, the method including patterning anodes in pixels, forming a bank including at least one opening portion, at which the anodes are exposed, on the anodes, forming a shield layer between the pixels, depositing a first light emitting unit material on an entire surface of a substrate, forming a first main light emitting unit including the first light emitting unit material in the pixels by removing the shield layer, depositing a first charge generating layer on an entire surface of the substrate, depositing an additional light emitting layer on an entire surface of the substrate, and depositing a cathode on an entire surface of the substrate, wherein the first main light emitting units are separated from each other, a first light emitting unit comprises the first main light emitting units, and the first charge generating layer is separated at each of both ends of the first main light emitting unit.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 3 is an exemplary diagram illustrating a cross-sectional surface taken along line A-A' illustrated in FIG. 1;

DETAILED DESCRIPTION OF THE EMBODIMENTS

Figure 1:
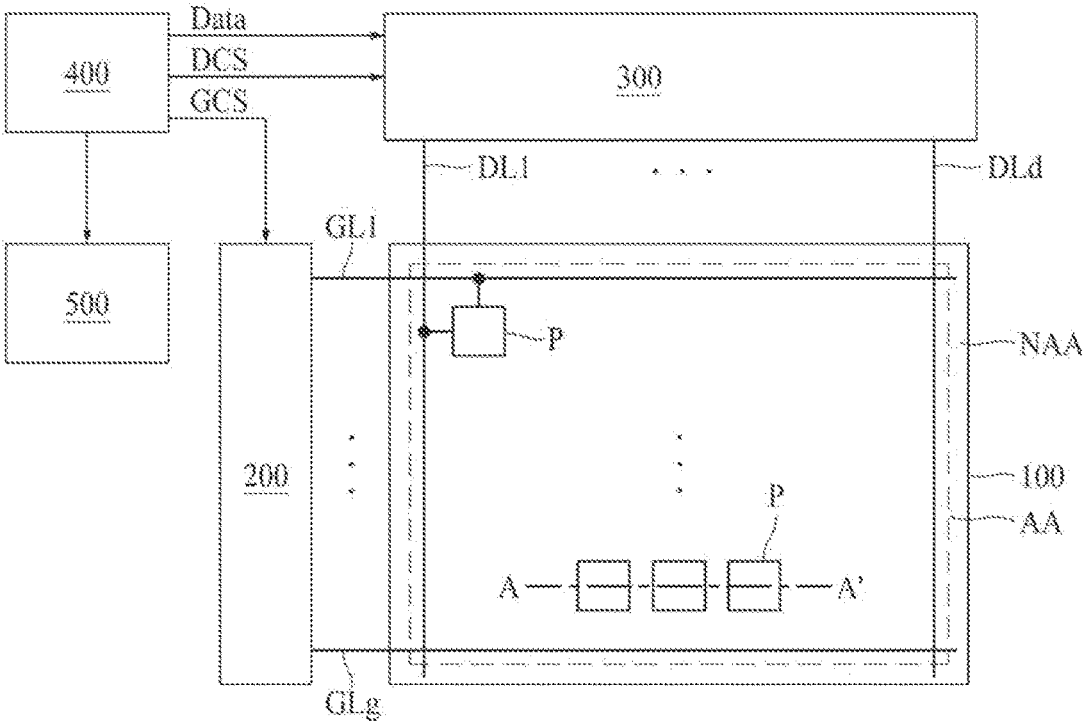
FIG. 1 is an exemplary diagram illustrating a configuration of a light emitting display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part can be added unless "only" is used. The terms of a singular form can include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case that is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another, and may not define order or sequence. For example, a first element could be termed a second element, and, similarly, a second element could be termed a first element, without departing from the scope of the present disclosure.

In describing elements of the present disclosure, the terms "first," "second," "A," "B," "(a)," "(b)," etc. can be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. All the components of each light emitting display apparatus according to all embodiments of the present disclosure are operatively coupled and configured.

Figure 2:
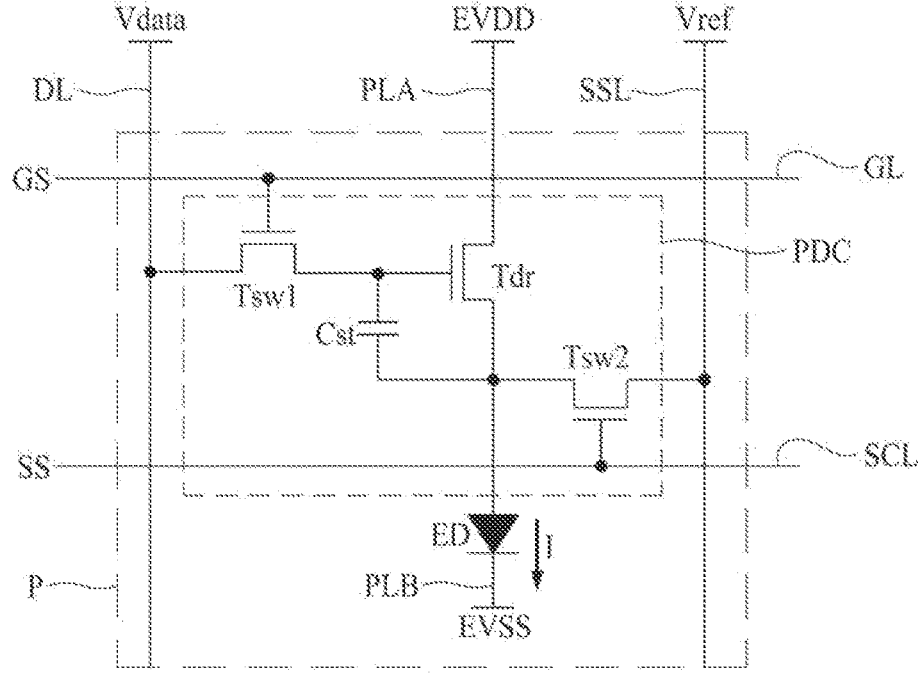
FIG. 2 is an exemplary diagram illustrating a structure of a pixel applied to a light emitting display apparatus according to an embodiment of the present disclosure.

FIG. 1 is an exemplary diagram illustrating a configuration of a light emitting display apparatus according to the present disclosure, and FIG. 2 is an exemplary diagram illustrating a structure of a pixel applied to a light emitting display apparatus according to the present disclosure.

The display apparatus according to one or more embodiments of the present disclosure can configure various electronic devices. The electronic devices can include, for example, smartphones, tablet personal computers (PCs), televisions (TVs), and monitors.

The display apparatus according to an embodiment of the present disclosure, as illustrated in FIG. 1, can include a light emitting display panel 100 which includes a display area (active area) AA displaying an image and a non-display area (non-active area) NAA provided outside the display area AA, a gate driver 200 which supplies a gate signal to a plurality of gate lines GL1 to GLg provided in the display area AA of the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply 500 which supplies power to the controller 400, the gate driver 200, the data driver 300, and the light emitting display panel 100. Here, g and d can be positive numbers such as positive integers.

First, the light emitting display panel 100 can include the display area AA and the non-display area NAA. The gate lines GL1 to GLg, the data lines DL1 to DLd, and the pixels P can be provided in the display area AA. Accordingly, the display area AA can display an image. Here, g and d can each be a natural number. The non-display area NAA can surround an outer portion of the display area AA.

The pixel P included in the display panel 100, as illustrated in FIG. 2, can include a pixel driving circuit PDC, which includes a switching transistor Tsw1, a storage capacitor Cst, a driving transistor Tdr, and a sensing transistor Tsw2, and a light emitting device ED. Each pixel P in the light emitting display panel 100 of FIG. 1 can have the configuration of the pixel of FIG. 2 or other suitable configurations.

A first terminal of the driving transistor Tdr can be connected to a first voltage supply line PLA through which a first voltage EVDD is supplied, and a second terminal of the driving transistor Tdr can be connected to the light emitting device ED.

A first terminal of the switching transistor Tsw1 can be connected to the data line DL, a second terminal of the switching transistor Tsw1 can be connected to a gate of the driving transistor Tdr, and a gate of the switching transistor Tsw1 can be connected to a gate line GL.

A data voltage Vdata can be supplied to a data line DL, and a gate signal GS can be supplied to the gate line GL.

The sensing transistor Tsw2 can be provided for measuring a threshold voltage or mobility of the driving transistor. A first terminal of the sensing transistor Tsw2 can be connected to a second terminal of the driving transistor Tdr and the light emitting device ED, a second terminal of the sensing transistor Tsw2 can be connected to a sensing line SSL through which a reference voltage Vref is supplied, and a gate of the sensing transistor Tsw2 can be connected to a sensing control line SCL through which a sensing control signal SS is supplied.

The sensing line SSL can be connected to the data driver 300 and can be connected to the power supply 500 through the data driver 300. For example, the reference voltage Vref supplied from the power supply 500 can be supplied to the pixels through the sensing line SSL, and sensing signals transferred from the pixels can be processed by the data driver 300.

The light emitting device ED includes a first electrode supplied with a first voltage EVDD through the driving transistor Tdr, a second electrode connected to a second voltage supply line PLB supplied with the second voltage EVSS, and a light emitting layer provided between the first electrode and the second electrode. In the following description, the first electrode is referred to as an anode, and the second electrode is referred to as a cathode.

A structure of the pixel P applied to the present disclosure is not limited to a structure illustrated in FIG. 2. Accordingly, the structure of the pixel P can be changed to various types.

The controller 400 can realign input image data transferred from an external system by using a timing synchronization signal transferred from the external system and can generate data control signals DCS which are to be supplied to the data driver 300 and gate control signals GCS which are to be supplied to the gate driver 200.

To this end, the controller 400 can include a data aligner which realigns input image data to generate image data Data and supplies the image data Data to the data driver 300, a control signal generator which generates the gate control signal GCS and the data control signal DCS by using the timing synchronization signal, an input unit which receives the timing synchronization signal and the input image data transferred from the external system and respectively transfers the timing synchronization signal and the input image data to the control signal generator and the data aligner, and an output unit which supplies the data driver 300 with the image data Data generated by the data aligner and the data control signal DCS generated by the control signal generator and supplies the gate driver 200 with the gate control signals GCS generated by the control signal generator.

The external system can perform a function of driving the controller 400 and an electronic device. For example, when the electronic device is a TV, the external system can receive various sound information, video information, and letter information over a communication network and can transfer the received video information to the controller 400. In this case, the image information can include input image data.

The power supply 500 can generate various powers and can supply the generated powers to the controller 400, the gate driver 200, the data driver 300, and the display panel 100.

The gate driver 200 can be configured as an integrated circuit (IC) and mounted in the non-display area NAA. Further, the gate driver 200 can be directly embedded in the non-display area NAA by using a gate in panel (GIP) type.

In a case which uses the GIP type, transistors configuring the gate driver 200 can be provided in the non-display area NAA through the same process as transistors included in each of the pixels P.

The gate driver 200 can supply gate pulses GP1 to GPg to the gate lines GL1 to GLg.

When a gate pulse generated by the gate driver 200 is supplied to the gate of the switching transistor Tsw1 included in the pixel P, the switching transistor Tsw1 can be turned on. When the switching transistor Tsw1 is turned on, a data voltage Vdata supplied through a data line can be supplied to the pixel P.

When a gate off signal generated by the gate driver 200 is supplied to the switching transistor Tsw1, the switching transistor Tsw1 can be turned off. When the switching transistor Tsw1 is turned off, a data voltage may not be supplied to the pixel P any longer.

The gate signal GS supplied to the gate line GL can include the gate pulse GP and the gate off signal.

Finally, the data driver 300 can be mounted on a chip on film (COF) attached on the light emitting display panel 100, or can be directly equipped in the light emitting display panel 100.

The data driver 300 can supply data voltages Vdata to the data lines DL1 to DLd.

Figure 3:
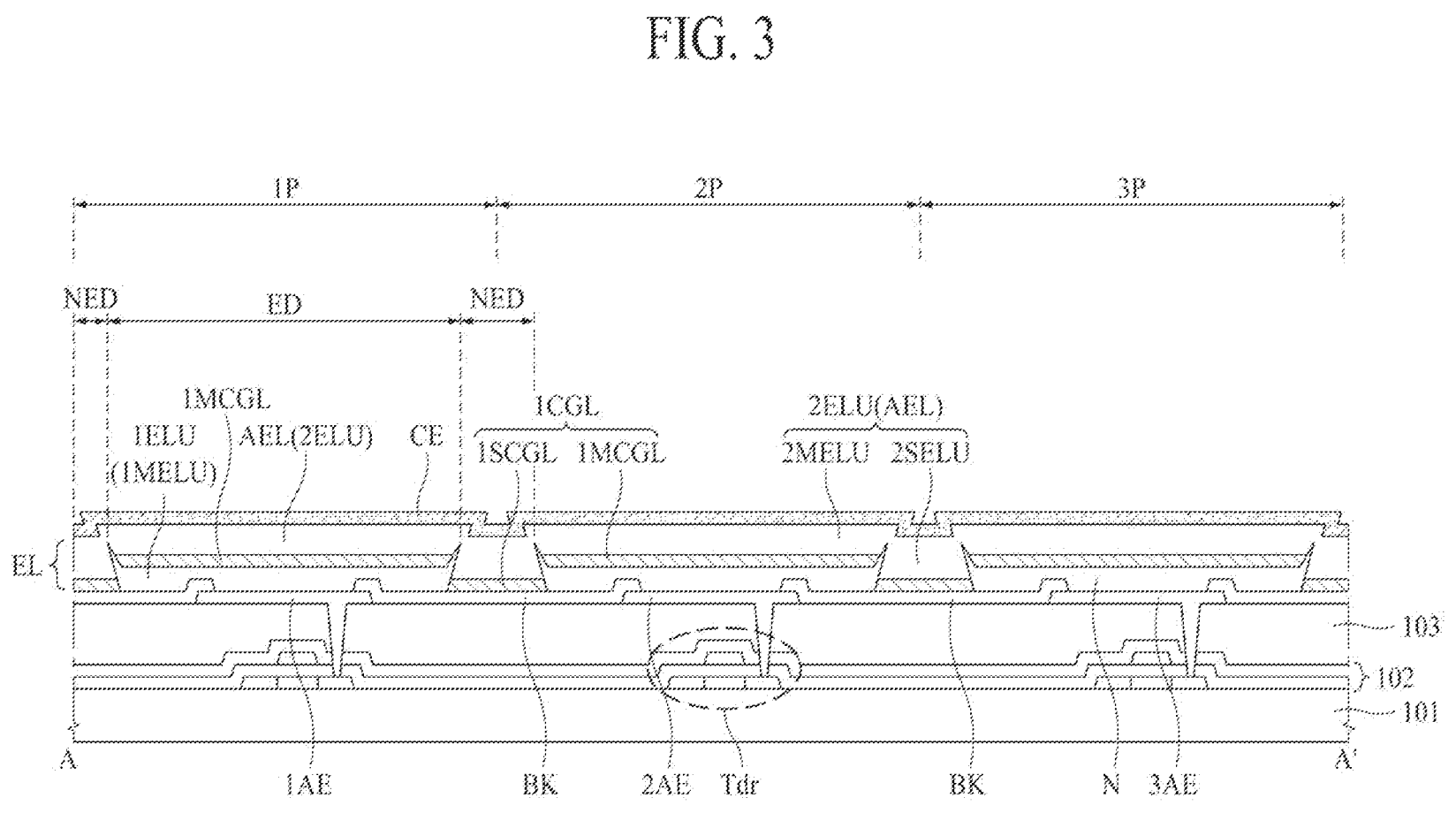

FIG. 3 is an exemplary diagram illustrating a cross-sectional surface taken along line A-A' illustrated in FIG. 1. Specifically, FIG. 3 illustrates a cross-sectional surface of three pixels adjacent to each other.

As described above, the light emitting display apparatus according to the present disclosure can include a light emitting display panel 100, a controller 400, a gate driver 200, a data driver 300 and a power supply 500.

The display panel 100 can include a display area AA which displays an image and a non-display area NAA which surrounds an outer portion of the display area. Pixels P can be included in the display area AA.

The light emitting display panel 100, as illustrated in FIG. 3, can include a substrate 101, a circuit layer 102 provided on the substrate 101, a planarization layer 103 which covers the circuit layer 102, anodes AE, a bank BK which includes an opening portion at which anodes are exposed, a light emitting layer EL which covers the anodes and the bank BK, and a cathode CE which covers the light emitting layer EL.

In more detail, the light emitting display panel 100 includes a first anode 1AE provided in a substrate 101 and in a first pixel 1P, a second anode 2AE provided in the substrate 101 and in a second pixel 2P, a bank BK which is provided on the first anode 1AE and the second anode 2AE and includes opening portions N at which the first anode 1AE and the second anode 2AE are exposed, a first light emitting unit 1ELU which includes a first main light emitting unit 1MELU provided on the first anode 1AE, a first charge generating layer 1CGL provided in an upper surface of the first main light emitting unit 1MELU and in an upper surface of the bank BK exposed between the first anode 1AE and the second anode 2AE, an additional light emitting layer AEL which covers the first charge generating layer 1CGL, and a cathode CE which covers the additional light emitting layer AEL.

The substrate 101 can be a glass substrate or various kinds of films made of various types of synthetic resins such as polyimide.

Transistors and a capacitor which configure a pixel driving circuit PDC can be provided in the circuit layer 102. To this end, the circuit layer 102 includes at least two insulation layers and metals provided between the at least two insulation layers.

The planarization layer 103 can planarize an upper surface of the circuit layer 102. The planarization layer 103 can include at least one layer.

A light emitting device ED includes an anode AE, a light emitting layer EL and a cathode CE. Anodes AE are exposed through opening portion N provided in a bank BK. For example, the anode AE exposed through the opening portion N is covered by the light emitting layer, the light emitting layer EL is covered by the cathode CE. Therefore, the bank BK is provided on the anodes AE and includes opening portions N at which the anodes AE are exposed.

The anode AE can be provided in each of the pixels P and anodes AE can be separated from each other. Hereinafter, for convenience of description, the present disclosure will be described with reference to three pixels P as illustrated in FIGS. 1 and 3.

In this case, the three pixels P can include a first pixel 1P, a second pixel 2P, and a third pixel 3P. A first anode 1AE is provided in the first pixel 1P, a second anode 2AE is provided in the second pixel 2P, and a third anode 3AE is provided in the third pixel 3P. The first anode 1AE, the second anode 2AE, and the third anode 3AE are provided in a substrate 101, and particularly, provided on a planarization layer 103.

A structure of the first pixel 1P can be the same as a structure of the second pixel 2P and the third pixel 3P. Therefore, in the following description, like reference numerals can refer to like elements provided in the first pixel 1P, the second pixel 2P and the third pixel 3P.

A light emitting layer EL, as illustrated in FIG. 3, can include a first light emitting unit 1ELU, a first charge generating layer 1CGL, and an additional light emitting layer AEL First, the first light emitting unit 1ELU can be provided on the first anode 1AE. Particularly, the first light emitting unit 1ELU can be provided on the first anode 1AE and on a portion of the bank BK which covers the first anode 1AE. For example, the first light emitting unit 1ELU may not be continuously provided in the first pixel 1P and the second pixel 2P.

In the following description, the first light emitting unit 1ELU can be a first main light emitting unit 1MELU, or the first light emitting unit 1ELU can include a first main light emitting unit 1MELU A first main light emitting unit 1MELU can be also provided on the second anode 1AE, and a first main light emitting unit 1MELU can be also provided on the third anode 3AE.

For example, the main light emitting unit 1MELU can be provided on an anode AE.

A first charge generating layer 1CGL can be provided in an upper surface of the first main light emitting unit 1MELU and in an upper surface of the bank BK exposed between the first anode 1AE and the second anode 2AE.

That is, the first charge generating layer 1CGL can be provided in an upper surface of the first main light emitting layer 1MELU provided on the first anode 1AE, in an upper surface of the bank BK exposed between the first anode 1AE and the second anode 2AE, in an upper surface of the first main light emitting unit 1MELU provided on the second anode 2AE, in an upper surface of the bank BK exposed between the second anode 2AE and the third anode 3AE, and in an upper surface of the first main light emitting unit 1MELU provided on the third anode 3AE.

The first charge generating layer 1CGL can include a first main charge generating layer 1MCGL provide in an upper surface of the first main light emitting unit 1MELU and a first sub charge generating layer 1SCGL provided in an upper surface of the bank BK.

That is, the first main charge generating layer 1MCGL can be provided in an upper surface of the first main light emitting unit 1MELU provided on the first anode 1AE. The first sub charge generating layer 1SCGL can be provided in an upper surface of the bank BK exposed between the first anode 1AE and the second anode 2AE. The first main charge generating layer 1MCGL can be provided in an upper surface of the first main light emitting unit 1MELU provided on the second anode 2AE. The first sub charge generating layer 1SCGL can be provided in an upper surface of the bank exposed between the second anode 2AE and the third anode 3AE. The first main charge generating layer 1MCGL can be provided in an upper surface of the first main light emitting unit 1MELU provided on the third anode 3AE.

To provide an additional description, the first main charge generating layer 1MCGL can be provided on the first main light emitting unit 1MELU provided in each of the pixels, and the sub charge generating layer 1SCGL can be provided in an upper surface of the bank BK exposed between the pixels.

In this case, as illustrated in FIG. 3, the first main charge generating layer 1MCGL can be separated from the first sub charge generating layer 1SCGL at the end (end area) of the first main light emitting unit 1MELU For example, in FIG. 3, the first main charge generating layer 1MCGL provided in the second pixel 2P can be separated from the first sub charge generating layer 1SCGL, which is provided between the first pixel 1P and the second pixel 2P, by the left end of the first main light emitting unit 1MELU provided in the second pixel 2P. Therefore, the first main light emitting unit 1MELU provided in the first pixel 1P can be separated from the first main light emitting unit 1MELU provided in the second pixel 2P.

Moreover, the first main charge generating layer 1MCGL provided in the second pixel 2P can be separated from the first sub charge generating layer 1SCGL, which is provided between the second pixel 2P and the third pixel 3P, by the right end of the first main light emitting unit 1MELU provided in the second pixel 2P.

The reason that the first main charge generating layer 1MCSG and the first sub charge generating layer 1SCGL are separated by the first main light emitting unit 1MELU is because the end (end area) of the first main light emitting unit 1MELU protrudes toward the upward direction of the plane of the first main light emitting unit 1MELU The end of the first main light emitting unit 1MELU protruding toward the upward direction of the plane of the first main light emitting unit 1MELU can denote that the end of the first main light emitting unit 1MELU protrudes in a direction vertical to the plane of the first main light emitting unit 1MELU. The vertical direction does not necessarily mean an angle of ninety degree. To provide an additional description, the end of the first main light emitting unit 1MELU protruding toward the upward direction of the plane of the first main light emitting unit 1MELU can denote that the end of the first main light emitting unit 1MELU protrudes toward the upward direction of the first main light emitting unit 1MELU or the end of the first main light emitting unit 1MELU protrudes toward the upward direction of the substrate 101 or the end of the first main light emitting unit 1MELU protrudes at an angle with the substrate.

Therefore, an upper end of the first main light emitting unit 1MELU has a central portion that is more concave than both edges. For example, the central portion of the first main light emitting unit 1MELU is more concave than edges of the first main light emitting unit 1MELU Accordingly, each of both ends of the first main light emitting unit 1ELU is formed higher than the plane of the central portion of the first main light emitting unit 1ELU. For example, the outer portion of the first main light emitting unit 1ELU is formed higher than the central portion of the first main light emitting unit 1ELU.

Particularly, each of both ends of the first main light emitting unit 1MELU is inclined in an outer direction of the first main light emitting unit 1MELU, for example, is inclined toward another first main light emitting unit 1MELU. Accordingly, the first main charge generating layer 1MCGL and the first sub charge generating layer 1SCGL can be separated from each other with the first main light emitting unit 1MELU therebetween.

Finally, the additional light emitting layer AEL can cover the first charge generating layer 1CGL.

The additional light emitting layer AEL can include only a second light emitting unit 2ELU, or can include a second light emitting unit 2ELU, a second charge generating layer, and a third light emitting unit, or can include at least three light emitting units and at least two charge generating layers.

In the following description, the additional light emitting layer AEL including one light emitting unit, for example, only the second light emitting unit 2ELU will be described with reference to FIGS. 3 and 6, the additional light emitting layer AEL including two light emitting units will be described with reference to FIGS. 5 and 7, and the additional light emitting layer AEL including at least three light emitting units will be described with reference to FIG. 8.

For example, the additional light emitting layer AEL, as illustrated in FIG. 3, can include only the second light emitting unit 2ELU.

In this case, the second light emitting unit 2ELU can include a second main light emitting unit 2MELU, which is provided on the first main charge generating layer 1MCGL, and a second sub light emitting unit 2SELU, which is provided on the first sub charge generating layer 1SCGL.

As described above, the first main charge generating layer 1MCGL and the first sub charge generating layer 1SCGL can be separated from each other by the first main light emitting unit 1MELU However, the second main light emitting unit 2MELU provided on the first main charge generating layer 1MCGL and the second sub light emitting unit 2SELU provided on the first sub charge generating layer 1SCGL can be continuously formed as illustrated in FIG. 3.

Moreover, when each of the second main light emitting unit 2MELU and the second sub light emitting unit 2SELU includes at least three layers, at least one layer included in the second main light emitting unit 2MELU can be separated from at least one layer included in the second sub light emitting unit 2SELU. In this case, the at least one layer separated can be adjacent to the first main charge generating layer 1MCGL or the first sub charge generating layer 1MCGL.

To provide additional description, a leakage current between two adjacent pixels occurs due to a charge generating layer continuously provided in the two adjacent pixels. Accordingly, in the present disclosure for preventing a leakage current, the first charge generating layer 1CGL can be separated between two adjacent pixels.

For example, as described above, the first main charge generating layer 1MCGL provided in the first pixel 1P, the first sub charge generating layer 1SCGL provided between the first pixel 1P and the second pixel 2P, and the first main charge generating layer 1MCGL provided in the second pixel 2P can be separated from each other. Accordingly, the first main charge generating layer 1MCGL provided in the first pixel 1P can be separated from the first main charge generating layer 1MCGL provided in the second pixel 2P.

However, the second light emitting unit 2ELU may not directly affect a leakage current between two adjacent pixels. Accordingly, the second light emitting unit 2ELU can be continuously formed between two adjacent pixels.

A thickness of the central portion of the first main light emitting unit 1MELU and the heights of both ends of the first main light emitting unit 1MELU can be variously set so that the first charge generation layer 1CGL can be separated.

In this case, if the thickness of the central portion of the first main light emitting unit 1MELU and each of the heights of both ends of the first main light emitting unit 1MELU are sufficiently greater than the thickness and the height capable of separating the first charge generating layer 1CGL, at least one of the at least three layers configuring the second light emitting unit 2ELU can be separated at each of both ends of the first main light emitting unit 1MELU.

The light emitting device emitting a light can include an anode AE and elements provided on the anode AE. For example, the light emitting device ED can include the anode AE, the first main light emitting unit 1MELU, the first main charge generating layer 1MCGL, the second main light emitting unit 2MELU and the cathode CE.

Moreover, a non-light emitting device NED means an element provided between the light emitting devices. Except for the anode AE and the first main light emitting unit 1MELU, the non-light emitting device NED can include the same materials as the light emitting device ED. Accordingly, the non-light emitting device NED cannot emit a light. For example, the non-light emitting device NED can include the first sub charge generating layer 1SCGL provided in an upper surface of the bank BK, the second sub light emitting unit 2SELU, and the cathode CE.

In the non-light emitting device NED provided in an area where an anode is not provided, a light is not emitted, and thus, as described above, a light emitting layer configuring the light emitting device ED and a light emitting layer configuring the non-light emitting device NED can be separated from each other. Particularly, in the present disclosure, in order to prevent a leakage current through the non-light emitting device NED, the first charge generating layer 1CGL can be divided to the first main charge generating layer 1MCGL and the first sub charge generating layer 1SCGL. However, because the second light emitting unit 2MELU does not significantly affect the leakage current, the layers configuring the second light emitting unit 2MELU may not be separated, or only some of the layers configuring the second light emitting unit 2MELU can be separated.

The cathode CE can cover the additional light emitting layer AEL. For example, the cathode CE can be provided on the light emitting layer EL, and particularly, can cover an upper end of the additional light emitting layer AEL provided in an upper end of the light emitting layer EL.

When the additional light emitting layer AEL includes only the second light emitting unit 2ELU as illustrated in FIG. 3, as described above, all layers included in the second light emitting unit 2ELU may not be separated with respect to the first main light emitting unit 1MELU, or at least one layer included in the second light emitting unit 2ELU can be separated with respect to the first main light emitting unit 1MELU. In this case, the at least one layer separated can be adjacent to the first main charge generating layer 1MCGL or the first sub charge generating layer 1MCGL. Accordingly, among the layers configuring the second light emitting unit 2ELU, at least one layer provided on the upper end of the second light emitting unit 2ELU may not be separated with respect to the first main light emitting unit 1MELU Therefore, the cathode CE may not be separated with respect to the first main light emitting unit 1MELU, and can be continuously formed. Accordingly, the cathode CE can be continuously formed in all of the pixels.

Therefore, the same second voltage can be supplied to all pixels through the cathode CE.

An encapsulation layer can be provided on the cathode CE. For example, the encapsulation layer can cover the cathode CE to protect the cathode CE. The encapsulation layer can be formed of at least one layer.

A color filter can be provided on the cathode CE or inside of the planarization layer 103 or on the bottom of the planarization layer 103. For example, color filters outputting different colors can be provided in the first pixel 1P to the third pixel 3P. However, when the light emitting layers provided in the first pixel 1P to the third pixel 3P output different colors by themselves, a color filter may not be provided in the first pixel 1P to the third pixel 3P.

Moreover, the color filter can be provided only in some of the first pixel 1P to the third pixel 3P. For example, when a reflector is provided on the bottom of the anode provided each of the first pixel 1P to the third pixel 3P, different colors of light can be output by adjusting a distance between the anode AE and the reflector. In this case, a color filter may not be provided in at least one of the first pixel 1P, the second pixel 2P and the third pixel 3P.

FIGS. 4A to 4F are exemplary diagrams illustrating a manufacturing method of a light emitting display apparatus according to an embodiment of the present disclosure, and particularly, exemplary diagrams illustrating a manufacturing method of the light emitting display panel as illustrated in FIG. 3.

Figure 4A:
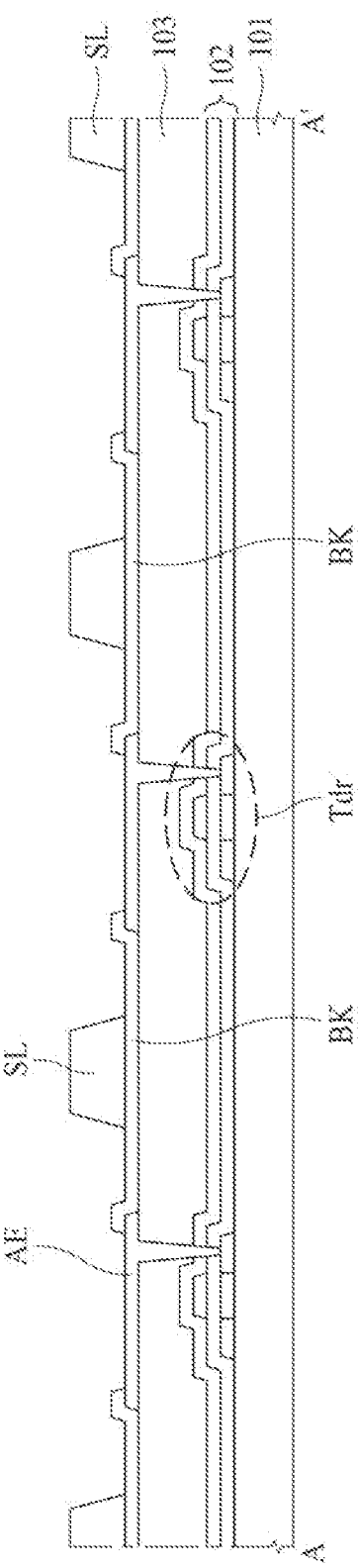
FIGS. 4A to 4F are exemplary diagrams illustrating a manufacturing method of a light emitting display apparatus according to an embodiment of the present disclosure.

First, as illustrated in FIG. 4A, a circuit layer 102 can be provided on a substrate 101, the circuit layer 102 can be covered by the planarization layer 103, anodes AE can be provided on the planarization layer 103, a bank BK can be provided to cover the ends of the anodes AE, and a shield layer SL can be provided on the upper surface of the bank BK. A shield layer SL is provided between the pixels P.

Here, the shielding layer SL can be a material that does not damage the organic layer even though it is close to the organic layer such as the first main light emitting unit 1MELU. For example, the shield layer SL can include a water-based polymeric material or a fluorine-based polymeric material. For example, the water-based polymeric material of the shield layer SL can be a hydrophilic organic material such as polyethylene glycol (PEG), polyvinyl alcohol (PVA), or polyvinyl acetate (PVAc). Further, the fluorine-based polymeric material can be a fluoropolymer material. In the fluoropolymer material, carbon-carbon bonds are continuously formed in a chain structure, and a large amount of fluorine (F) is contained in a functional group of the fluoropolymer material.

Figure 4B:
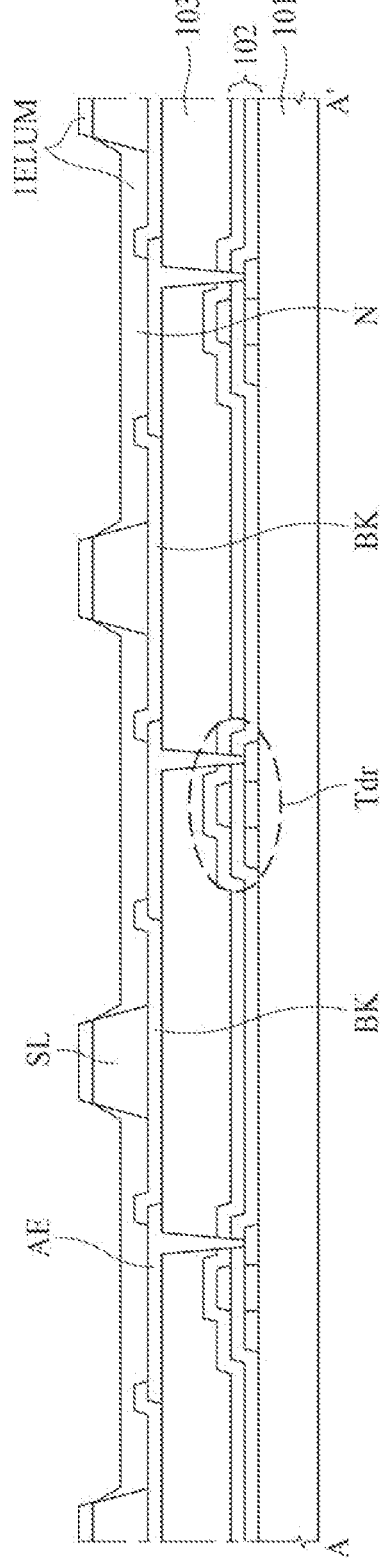

Next, as illustrated in FIG. 4B, a first light emitting unit material 1ELUM is deposited on the entire surface of the substrate 101. In this case, the first light emitting unit material 1ELUM is deposited on the side surface and the upper surface of the shield layer SL.

The height of the shield layer SL is set to be greater than the thickness of the first light emitting unit material 1ELUM. Therefore, the height of the first emitting unit material 1ELUM provided on the side of the shield layer SL is greater than the height of the first emitting unit material 1ELUM provided on the anode AE with respect to the upper surface of the planarization layer 103.

Figures 4C, 4D:
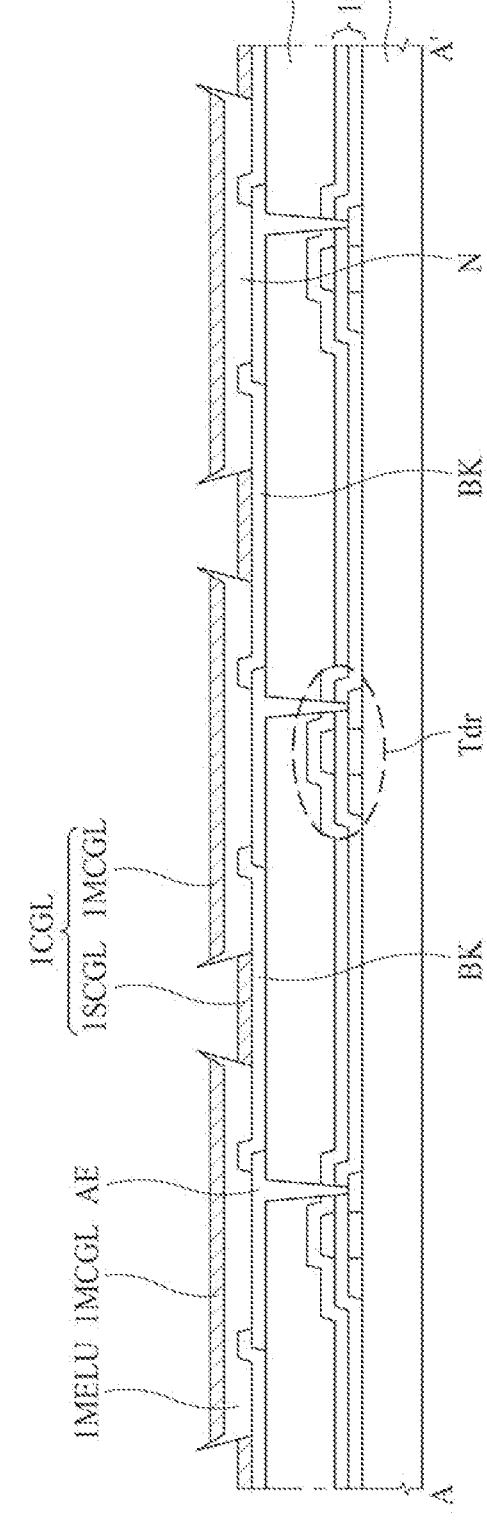

Next, as illustrated in FIG. 4C, the shield layer SL is removed. In this case, the first light emitting unit material 1ELUM deposited on the upper surface of the shield layer SL is removed along with the shield layer SL.

However, even if the shield layer SL is removed, the first light emitting unit material 1ELUM deposited on the side of the shield layer SL remains without being removed. The first light emitting unit material 1ELUM deposited on the side surface of the shield layer SL forms an end of the first main light emitting unit 1MELU.

Accordingly, as illustrated in FIG. 4C, the first main light emitting unit 1MELU is provided on the anode AE.

In this case, as described above, since the height of the first light emitting unit material 1ELUM provided on the side surface of the shield layer SL is greater than the height of the first light emitting unit material 1ELUM provided on the anode AE, the height of each of both ends of the first main light emitting unit 1MELU is greater than the height of a plane of the first main light emitting unit 1MELU For example, the end of the first main light emitting unit 1MELU protrudes toward an upward direction of the plane of the first main light emitting unit 1MELU In addition, since the width of the upper end of the shield layer SL is smaller than the width of the lower end of the shield layer SL, the side surface of the shield layer SL is inclined toward the center of the shield layer SL. Accordingly, each of both ends of the first main light emitting unit 1MELU, which remains after the shield layer SL is removed, is inclined toward the outer direction of the first main light emitting unit 1MELU, for example, toward another first main light emitting unit 1MELU Next, as illustrated in FIG. 4D, a first charge generating layer 1CGL is provided on the entire surface of the substrate 101.

In this case, each of both ends of the first main light emitting unit 1ELU is formed higher than the plane of the central portion of the first main light emitting unit 1ELU. Particularly, each of both ends of the first main light emitting unit 1MELU is inclined toward an outer direction of the first main light emitting unit 1MELU, for example, toward another first main light emitting unit 1MELU Accordingly, the first charge generating layer 1CGL is separated at each of both ends of the first main light emitting unit 1MELU. For example, the first main charge generating layer 1MCGL provided on the upper surface of the first main light emitting unit 1MELU and the first sub charge generating layer 1SCGL provided outside the first main light emitting unit 1MELU are separated from each other at each of both ends of the first main light emitting unit 1MELU In other words, the height difference between the upper surface of the bank BK and the end of the first main light emitting unit 1MELU is greater than the height difference between the upper surface of the first main light emitting unit 1MELU and the end of the first main light emitting unit 1MELU, and the thickness of the first charge generating layer 1CGL is smaller than the height difference between the upper surface of the first main light emitting unit 1MELU and the end of the first main light emitting unit 1MELU Accordingly, the first main charge generating layer 1MCGL provided on the upper surface of the first main light emitting unit 1MELU and the first sub charge generating layer 1SCGL provided on the upper surface of the bank BK cannot be formed continuously at the end of the first main light emitting unit 1MELU.

Figure 4E:
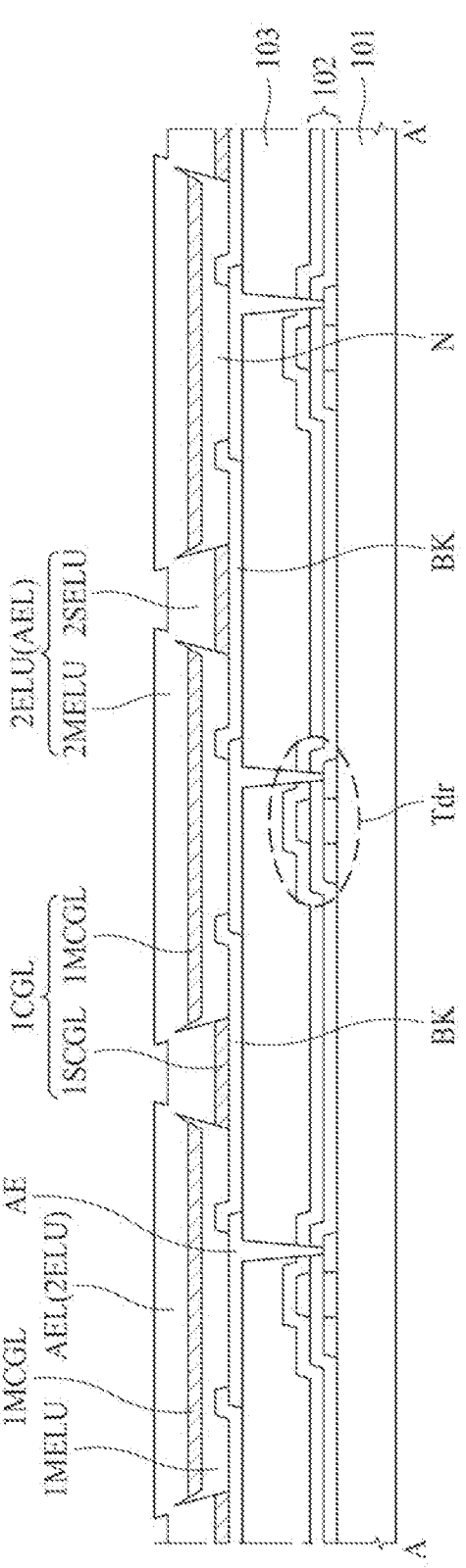

Next, as illustrated in FIG. 4E, a second light emitting unit 2ELU is provided on the first charge generating layer 1CGL.

Figure 4F:
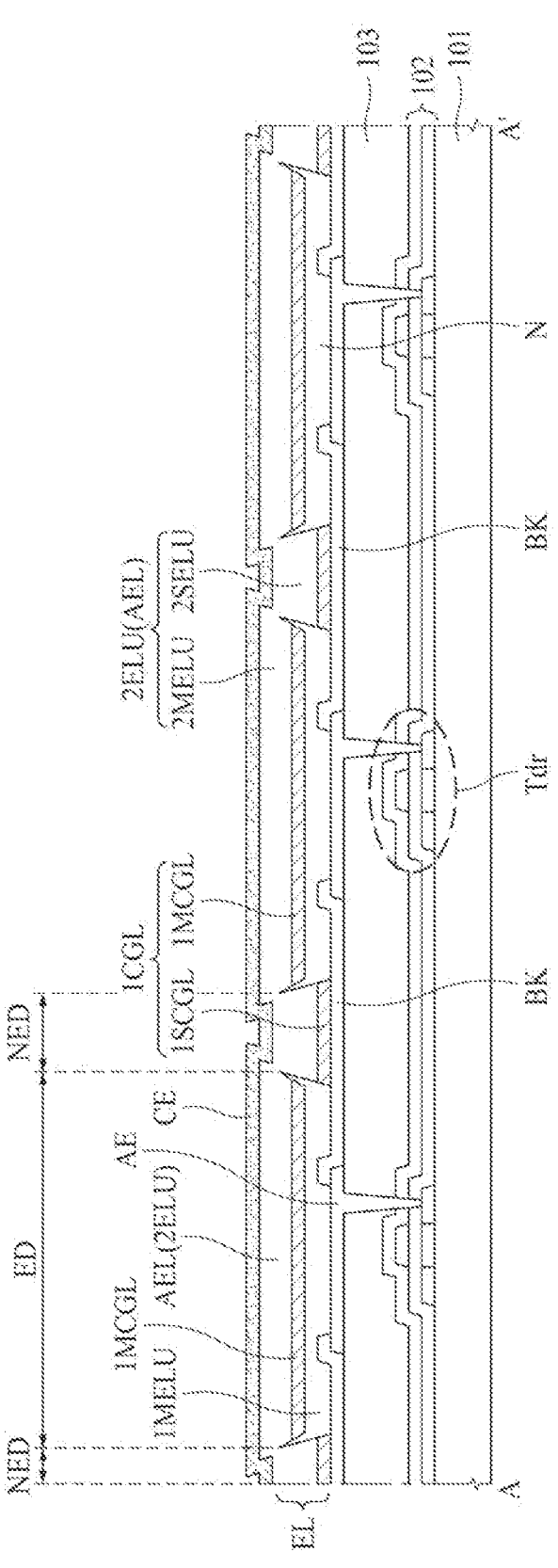

In this case, all of the at least three layers configuring the second light emitting unit 2ELU can be continuously formed at each of both ends of the first main light emitting unit 1MELU, respectively, or at least one of the at least three layers can be separated at each of both ends of the first main light emitting unit 1MELU Finally, as illustrated in FIG. 4F, a cathode CE is provided on the second light emitting unit 2ELU.

Figure 5:
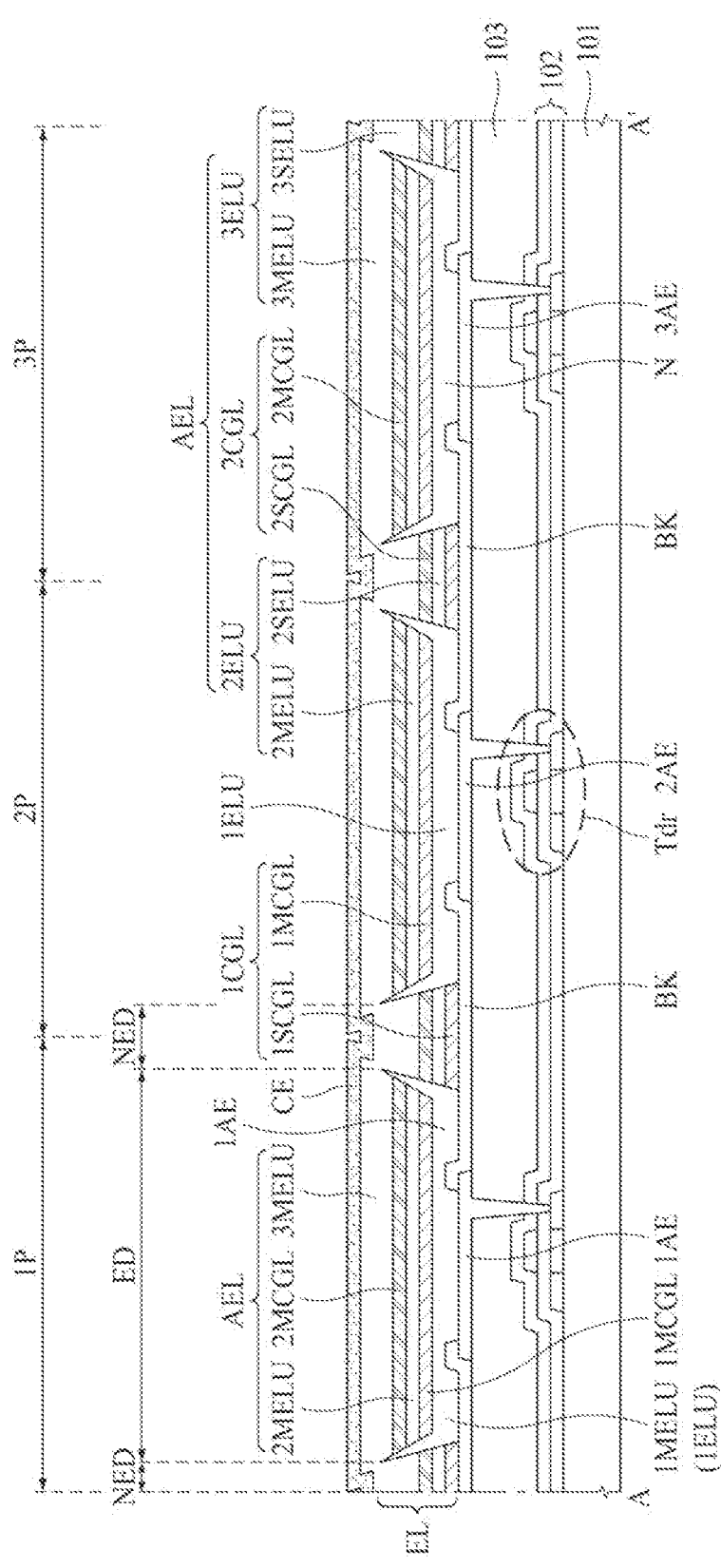
FIG. 5 is another exemplary diagram illustrating a cross-sectional surface taken along line A-A" illustrated in FIG. 1.

The cathode CE is continuously formed at each of both ends of the first main light emitting unit 1MELU FIG. 5 is another exemplary diagram illustrating a cross-sectional surface taken along line A-A" illustrated in FIG. 1. In the following description, details which are the same or similar to details described above with reference to FIGS. 1 to 4F are omitted or will be briefly described.

The light emitting display panel 100 can include a first anode 1AE provided in a substrate 101 and in a first pixel 1P, a second anode 2AE provided in the substrate 101 and in a second pixel 2P, a bank BK which is provided on the first anode 1AE and the second anode 2AE and includes opening portions N at which the first anode 1AE and the second anode 2AE are exposed, a first light emitting unit 1ELU which includes a first main light emitting unit 1MELU provided on the first anode 1AE, a first charge generating layer 1CGL provided in an upper surface of the first main light emitting unit 1MELU and in an upper surface of the bank BK exposed between the first anode 1AE and the second anode 2AE, an additional light emitting layer AEL which covers the first charge generating layer 1CGL, and a cathode CE which covers the additional light emitting layer AEL. The first charge generating layer 1CGL can include a first main charge generating layer 1MCGL provided on the upper surface of the first main light emitting unit 1MELU and a first sub charge generating layer 1SCGL provided on the upper surface of the bank BK. The first main charge generating layer 1MCGL is separated from the first sub charge generating layer 1SCGL at the end of the first main light emitting unit 1MELU In the present disclosure, an emitting layer EL can include the first light emitting unit 1ELU, the first charge generating layer 1CGL, and the additional light emitting layer AEL.

The additional light emitting layer AEL, as illustrated in FIG. 3, can include one light emitting unit, for example, only the second light emitting unit 2ELU.

However, the additional light emitting layer AEL, as illustrated in FIG. 5, can include two light emitting units.

For example, the additional light emitting layer AEL can include a second light emitting unit 2ELU, a second charge generating layer 2CGL provided on the second light emitting unit 2ELU, and a third light emitting unit 3ELU provided on the second charge generating layer 2CGL.

The second light emitting unit 2ELU can include a second main light emitting unit 2MELU provided on the first main charge generating layer 1MCGL and a second sub light emitting unit 2SELU provided on the first sub charge generating layer 1SCGL.

As described above, the first main charge generating layer 1MCGL and the first sub charge generating layer 1SCGL can be separated from each other by the first main light emitting unit 1MELU Further, the second main light emitting unit 2MELU provided on the first main charge generating layer 1MCGL and the second sub light emitting unit 2SELU can be separated from each other by the first main light emitting unit 1MELU.

For example, in the present disclosure described with reference to FIG. 3, feature of the present disclosure is that the first charge generating layer 1CGL is separated by the first main light emitting unit 1MELU Accordingly, all of the at least three layers configuring the second light emitting unit 2ELU need not be separated by the first main light emitting unit 1MELU For example, all of the at least three layers are not necessarily separated by the first main light emitting unit 1MELU However, in the light emitting display panel described with reference to FIG. 5, not only the first charge generating layer 1CGL, but also the second charge generating layer 2CGL included in the additional light emitting layer AEL should be separated by the first main light emitting unit 1MELU In order for the second charge generating layer 2CGL provided on the second main light emitting unit 2MELU to be separated by the first main light emitting unit 1MELU, the second light emitting unit 2MELU should be separated by the first main light emitting unit 1 MELU.

For example, in the light emitting display panel illustrated in FIG. 5, the second light emitting unit 2MELU can include the second main light emitting unit 2MELU provided on the first main charge generating layer 1MCGL and the second sub light emitting unit 2SELU provided on the first sub charge generating layer 1SCGL, and the second main light emitting unit 2MELU and the second sub light emitting unit 2SELU can be separated from each other by the first main light emitting unit 1MELU The second charge generating layer 2CGL can include the second main charge generating layer 2MCGL, which is provided on the second main light emitting unit 2MELU, and the second sub charge generating layer 2SCGL, which is provided on the second sub light emitting unit 2SELU.

In this case, the second charge generating layer 2CGL can be separated by the first main light emitting unit 1MELU For example, the second main charge generating layer 2MCGL and the second sub charge generating layer 2SCGL can be separated from each other with the first main light emitting unit 1MELU therebetween.

As described above, leakage current between two pixels adjacent to each other is generated by the charge generating layer continuously formed in the two pixels. Therefore, in the present disclosure for preventing leakage current, each of charge generating layers provided between two adjacent pixels can be separated at each of both ends of the first main light emitting unit 1MELU For example, the first charge generating layer 1CGL provided on the first light emitting unit 1ELU can include the first main charge generating layer 1MCGL provided on the first main light emitting unit 1MELU and the first sub charge generating layer 1SCGL provided outside of the first main light emitting unit 1MELU, and the first main charge generating layer 1MCGL and the first sub charge generating layer 1SCGL can be separated from each other at the end of the first main light emitting unit 1MELU.

Moreover, the second charge generating layer 2CGL provided on the second light emitting unit 2ELU can include the second main charge generating layer 2MCGL provided on the second main light emitting unit 2MELU and the second sub charge generating layer 2SCGL provided on the second sub light emitting unit 2SELU, and the second main charge generating layer 2MCGL and the second sub charge generating layer 2SCGL can be separated from each other at the end of the first main light emitting unit 1MELU For example, as described above, the first main charge generating layer 1MCGL provided in the first pixel 1P, the first sub charge generating layer 1SCGL provided between the first pixel 1P and the second pixel 2P, and the first main charge generating layer 1MCGL provided in the second pixel 2P can be separated from each other. Further, the second main light emitting unit 2MELU provided in the first pixel 1P, the second sub light emitting unit 2SELU provided between the first pixel 1P and the second pixel 2P, and the second main light emitting unit 2MELU provided in the second pixel 2P can be separated from each other.

Further, the second main charge generating layer 2MCGL provided in the first pixel 1P, the second sub charge generating layer 2SCGL provided between the first pixel 1P and the second pixel 2P, and the second main charge generating layer 2MCGL provided in the second pixel 2P can be separated from each other. Therefore, the first main charge generating layer 1MCLG and the second main charge generating layer 2MCGL, which are provided in the first pixel 1P, can be separated from the first main charge generating layer 1MCGL and the second main charge generating layer 2MCGL, which are provided in the second pixel 2P The thickness of the central portion of the first main light emitting unit 1MELU and the height of each of the both ends of the first main light emitting unit 1MELU can be variously set so that the first charge generating layer 1CGL, the second light emitting unit 2ELU, and the second charge generating layer 1CGL can be separated.

For example, if the thickness of the central portion of the first main light emitting unit 1MELU and the height of each of both ends of the first main light emitting unit 1MELU are sufficiently larger than a thickness and a height to separate the first charge generating layer 1CGL, the second light emitting unit 2ELU, and the second charge generating layer 2CGL, each of the first charge generating layer 1CGL, the second light emitting unit 2ELU, and the second charge generating layer 2CGL can be separated at each of both ends of the first main light emitting unit 1MELU The third light emitting unit 3ELU can be provided on the second charge generating layer 2CGL.

The third light emitting unit 3ELU can include a third main light emitting unit 3MELU provided on the second main charge generating layer 2MCGL and a third sub light emitting unit 3SELU provided on the second sub charge generating layer 2SCGL.

For example, as illustrated in FIG. 5, the additional light emitting layer AEL can include the second light emitting unit 2ELU and the third light emitting unit 3ELU.

The second light emitting unit 2ELU can include the second main light emitting unit 2MELU provided on the first main charge generating layer 1MCGL and the second sub light emitting unit 2SELU provided on the first sub charge generating layer 1SCGL. In this case, the second main light emitting unit 2MELU and the second sub light emitting unit 2SELU can be separated from each other at each of both ends of the first main light emitting unit 1MELU, as illustrated in FIG. 5.

However, the third main light emitting unit 3MELU provided on the second main charge generating layer 2MCGL and the third sub light emitting unit 3 SELU provided on the second sub charge generation layer 2SCGL can be formed continuously as illustrated in FIG. 5.

For example, the third light emitting unit 3ELU may not directly affect leakage current between two adjacent pixels.

Accordingly, the third light emitting unit 3ELU can be continuously formed between two adjacent pixels.

Moreover, when each of the third main light emitting unit 3MELU and the third sub light emitting unit 3 SELU includes at least three layers, at least one layer included in the third main light emitting unit 3MELU can be separated from at least one layer included in the third sub light emitting unit 3SELU. In this case, the at least one layer separated can adjacent to the second main charge generating layer 2MCGL or the second sub charge generating layer 2MCGL.

To provide an additional description, a leakage current between two pixels adjacent to each other is generated by a charge generating layer continuously formed in the two pixels. Therefore, in the present disclosure for preventing leakage current, each of the first charge generating layer 1CGL and the second charge generating layer 2CGL is separated between two adjacent pixels, and the second light emitting unit 2ELU provided between the first charge generating layer 1CGL and the second charge generating layer 2CGL can be also separated between two adjacent pixels.

However, since the third light emitting unit 3ELU provided on the second charge generating layer 2CGL may not directly affect the leakage current, the third light emitting unit 3ELU can be continuously formed between two adjacent pixels. Alternatively, at least one of at least three layers configuring the third light emitting unit 3ELU can be separated at each of both ends of the first main light emitting unit 1MELU In this case, a cathode CE provided on the third light emitting unit 3ELU should be continuously formed between two adjacent pixels.

Accordingly, a thickness of the central portion of the first main light emitting unit 1MELU and a height of each of both ends of the first main light emitting unit 1MELU can be variously set so that each of the first charge generating layer 1CGL, the second light emitting unit 2ELU, and the second charge generating layer 2CGL is separated, and a cathode CE provided on the third light emitting unit 3ELU is continuously formed.

Particularly, when at least one of the at least three layers configuring the third light emitting unit 3ELU is continuously formed at each of both ends of the first main light emitting unit 1MELU, a cathode CE can be continuously formed at each of both ends of the light emitting unit 1MELU In this case, the light emitting display panel illustrated in FIG. 5 can be manufactured through processes similar to those illustrated in FIGS. 4A to 4E.

First, for example, the first main light emitting unit 1MELU and the first main charge generating layer 1MCGL illustrated in FIG. 5 can be formed through the processes illustrated in FIGS. 4A to 4D.

Next, a second light emitting unit 2ELU and a second charge generating layer 2CGL can be sequentially deposited on the first main charge generating layer 1MCGL.

In this case, if a height difference between the plane of the first main light emitting unit 1MELU and the end of the first main light emitting unit 1MELU is sufficiently greater than the sum of the thickness of the first charge generating layer 1CGL, the thickness of the second light emitting layer 2ELU, and the thickness of the second charge generating layer 2CGL, each of the second light emitting unit 2ELU and the second charge generating layer 2CGL can be separated at the end of the first main light emitting unit 1MELU. For example, at the end of the first main light emitting unit 1MELU, the second main light emitting unit 2MELU and the second sub light emitting unit 2SELU can be separated from each other, and the second main charge generating layer 2MCGL and the second sub charge generating Layer 2SCGL can be separated from each other.

Next, a third light emitting unit 3ELU can be provided on the second charge generating layer 2CGL.

The third light emitting unit 3ELU can be provided on the second charge generating layer 2CGL as a type similar to the second light emitting unit 2ELU described with reference to FIG. 4E.

For example, all of the at least three layers configuring the third light emitting unit 3ELU can be continuously formed at each of both ends of the first main light emitting unit 1MELU, at least one of the at least three layers configuring the third light emitting unit 3ELU can be separated at each of both ends of the first main light emitting unit 1MELU, and at least one of the at least three layers configuring the third light emitting unit 3ELU can be continuously formed at each of both ends of the light emitting unit 1MELU.

Finally, as described with reference to FIG. 4F, a cathode CE can be provided on the third light emitting unit 3ELU.

Figure 6:
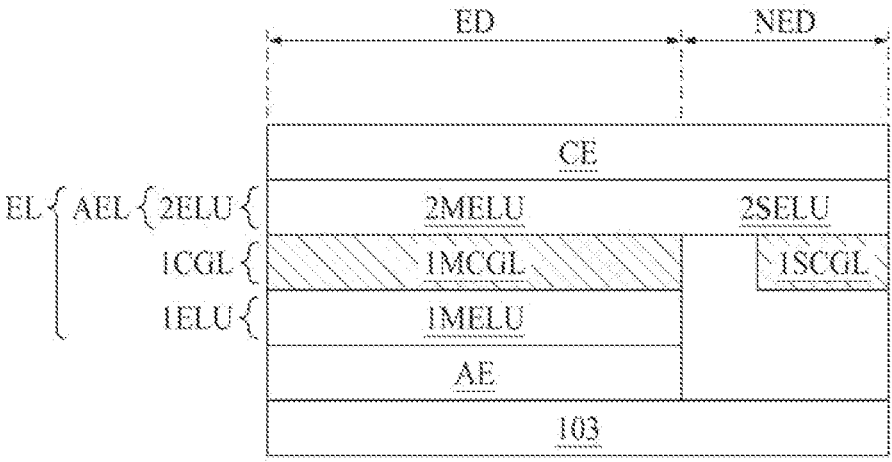
FIGS. 6 to 8 are exemplary diagrams schematically illustrating a cross-sectional surface of a light emitting display panel according to one or more embodiments of the present disclosure.
Figure 7:
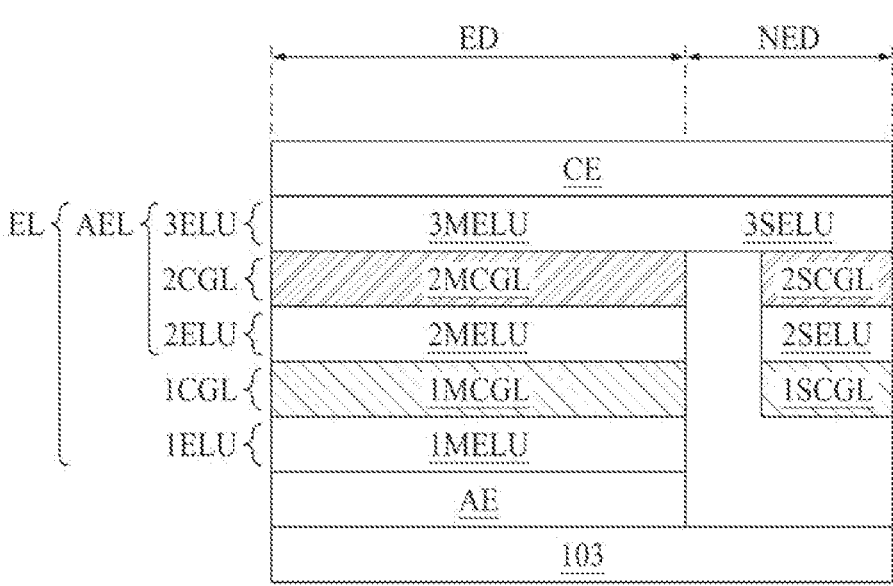
Figure 8:
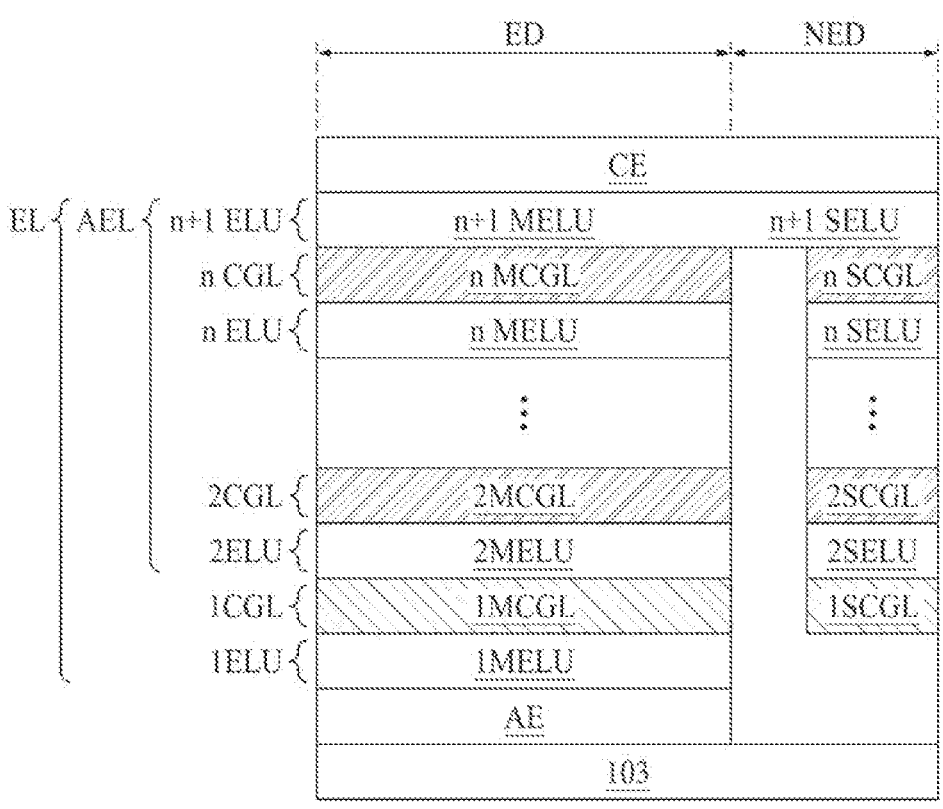

The cathode CE can be continuously formed at each of both ends of the first main light emitting unit 1MELU FIGS. 6 to 8 are exemplary diagrams schematically illustrating a cross-sectional surface of a light emitting display panel applied to the present disclosure.

The additional light emitting layer AEL can include only one light emitting unit, for example, the second light emitting unit 2ELU as illustrated in FIGS. 3 and 6, can include two light emitting units 2ELU and 3ELU and the second charge generating layer 2CGL as illustrated in FIGS. 5 and 7, and can include three or more light emitting units 2ELU to n+1ELU, where n is 3 or more natural number, and two or more charge generating layers 2CGL to nCGL as illustrated in FIG. 8.

First, for example, in the light emitting display panel 100 illustrated in FIGS. 3 and 6, only the second light emitting unit 2ELU can be included in the additional light emitting layer AEL.

A light emitting device ED can denote an area where an image is displayed among areas including the light emitting layer EL, and a non-light emitting device NED can denote an area where an image is not displayed among the areas including the light emitting layer EL.

The non-light emitting device NED is not provided with an element corresponding to the anode AE.

A first sub light emitting unit corresponding to the first main light emitting unit 1MELU is not provided in the non-light emitting device NED. For example, as described above, the first light emitting unit 1ELU can include only the patterned first main light emitting unit 1MELU.

The first main charge generating layer 1MCGL provided in the light emitting device ED can be separated from the first sub charge generating layer 1SCGL provided in the non-light emitting device NED. For example, the first charge generating layer 1CGL can be separated at each of both ends of the first main light emitting unit 1MELU.

Between the light emitting device ED and the non-light emitting device NED, all of the at least three layers configuring the second light emitting unit 2ELU can be continuously formed, at least one of the at least three layers configuring the second light emitting unit 2ELU can be separated, and at least one of the at least three layers configuring the second light emitting unit 2ELU can be continuously formed.

A cathode CE can be continuously provided between the light emitting device ED and the non-light emitting device NED. Therefore, the cathode CE can be provided in all pixels in common.

Second, for example, in the light emitting display panel 100 illustrated in FIGS. 5 and 7, the additional light emitting layer AEL can include the second light emitting unit 2ELU, the second charge generating layer 2CGL, and the third light emitting unit 3ELU.

The non-light emitting device NED is not provided with an element corresponding to the anode AE.

A first sub light emitting unit corresponding to the first main light emitting unit 1MELU is not provided in the non-light emitting device NED.

The first main charge generating layer 1MCGL provided in the light emitting device ED can be separated from the first sub charge generating layer 1SCGL provided in the non-light emitting device NED, the second main light emitting unit 2MELU included in the light emitting device ED can be separated from the second sub light emitting unit 2SELU provided in the non-light emitting device NED, and the second main charge generating layer 2MCGL provided in the light emitting device ED can be separated from the second sub charge generating layer 2SCGL provided in the non-light emitting device NED. For example, each of the first charge generating layer 1CGL, the second light emitting unit 2ELU, and the second charge generating layer 2CGL can be separated at each of both ends of the first main light emitting unit 1MELU.

Between the light emitting device ED and the non-light emitting device NED, all of the at least three layers configuring the third light emitting unit 3ELU can be continuously formed, at least one of the at least three layers configuring the third light emitting unit 3ELU can be separated, and at least one of the at least three layers configuring the third light emitting unit 3ELU can be continuously formed.

A cathode CE can be continuously provided between the light emitting device ED and the non-light emitting device NED. Therefore, the cathode CE can be provided in all pixels in common.

Third, in the light emitting display panel 100 illustrated in FIG. 8, the additional light emitting layer AEL can include three or more light emitting units, for example, the second light emitting unit 2ELU to a n+1th light emitting unit n+1ELU and two or more charge generating layers, for example, the second charge generating layer 2CGL to an nth charge generating layer nCGL. Here, n is a natural number greater than or equal to 3.

The non-light emitting device NED is not provided with an element corresponding to the anode AE.

A first sub light emitting unit corresponding to the first main light emitting unit 1MELU is not provided in the non-light emitting device NED.

The first main charge generating layer 1MCGL provided in the light emitting device ED can be separated from the first sub charge generating layer 1SCGL provided in the non-light emitting device NED, the second main light emitting unit 2MELU included in the light emitting device ED can be separated from the second sub light emitting unit 2SELU provided in the non-light emitting device NED, the second main charge generating layer 2MCGL provided in the light emitting device ED can be separated from the second sub charge generating layer 2SCGL provided in the non-light emitting device NED, a nth main light emitting unit nMELU provided in the light emitting device ED can be separated from a nth sub light emitting unit nSELU provided in the non-light emitting device NED, and a nth main charge generating layer nMCGL provided in the light emitting device ED can be separated from a nth sub charge generating layer nSCGL provided in the non-light emitting device NED. For example, each of the first charge generating layer 1CGL, the second light emitting unit 2ELU, the second charge generating layer 2CGL, the nth light emitting unit nELU, and the nth charge generating layer nCGL can be separated at each of both ends of the first main light emitting unit 1MELU.

Between the light emitting device ED and the non-light emitting device NED, all of the at least three layers configuring a n+1th light emitting unit n+1ELU can be continuously formed, at least one of the at least three layers configuring the n+1th light emitting unit n+1ELU can be separated, and at least one of the at least three layers configuring the n+1th light emitting unit n+1ELU can be continuously formed.

To provide an additional description, each of the at least two charge generating layers CGL included in the additional light emitting layer AEL can be separated at the end of the first main light emitting unit 1MELU Moreover, one of the at least two light emitting units ELU included in the additional light emitting layer AEL can be continuously provided at the end of the first main light emitting unit 1MELU. In this case, among the at least two light emitting units ELU, the continuously provided light emitting units ELU can be provided in an upper end of the additional light emitting layer AEL For example, among the at least two light emitting units ELU, the continuously provided light emitting units ELU can be adjacent to the cathode CE.

The cathode CE can be continuously provided between the light emitting device ED and the non-light emitting device NED. Accordingly, the cathode CE can be provided in all pixels in common.

In this case, the light emitting display panel illustrated in FIG. 8 can be manufactured through processes similar to the manufacturing processes of the light emitting display panel illustrated in FIG. 3 and to the manufacturing processes of the light emitting display panel illustrated in FIG. 5. Therefore, detailed descriptions thereof are omitted or may be briefly provided.

Generally, leakage current between pixels is generated by a charge generating layer provided in a light emitting layer EL. However, as described above, according to the present disclosure, the charge generating layer CGL provided in the light emitting display panel 100 can be separated at each of both ends of the first main light emitting unit 1MELU Therefore, according to the present disclosure, leakage current between pixels may not be generated or can be reduced.

In this case, each of the light emitting units 1ELU, 2ELU, 3ELU, nELU, and n+1ELU illustrated in FIGS. 6 to 8 can include at least three layers. For example, each of the light emitting units can include a hole transporting layer (HTL) adjacent to an anode AE, an electron transporting layer (ETL) adjacent to a cathode CE, and a light emitting material provided between the hole transporting layer (HTL) and the electron transporting layer (ETL).

In this case, the light emitting materials included in the light emitting units can emit the same light, the light emitting materials included in the light emitting units can emit different lights, and some of the light emitting materials provided in the light emitting units can emit the same light.

For example, each of the light emitting materials can output any one of various colors including blue, yellow-green, red, green, deep blue, sky blue, etc.

In this case, the light emitting device ED can output any one of various colors including blue, yellow-green, red, green, deep blue, sky blue, etc., and can output white.

Accordingly, a color filter may be or may not be provided in the light emitting display apparatus according to the present disclosure.

According to the present disclosure, during the manufacturing process of the light emitting display apparatus, each of both ends of the first main light emitting unit configuring the light emitting layer can protrude toward a direction vertical to the plane of the light emitting unit by using a shield layer provided between pixels through a photopatterning process.

A charge generating layer CGL provided on the first main light emitting unit can be separated between the pixels by both ends of the first main light emitting unit protruding between the pixels in a direction vertical to the plane of the first main light emitting unit. Accordingly, leakage current is not generated between the pixels, and thus, a degradation in quality of the light emitting display apparatus can be prevented.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display apparatus comprising:
   a first anode and a second anode provided on a substrate, the first anode provided in a first pixel and the second anode provided in a second pixel;
   a bank provided on the first anode and the second anode, and including at least one opening portion at which the first anode and the second anode are exposed:
   a first light emitting unit including a first main light emitting unit provided on the first anode;
   a first charge generating layer provided in an upper surface of the first main light emitting unit and in an upper surface of the bank exposed between the first anode and the second anode;
   an additional light emitting layer covering the first charge generating layer; and
   a cathode covering the additional light emitting layer,
   wherein the first charge generating layer comprises:
   a first main charge generating layer provided in an upper surface of the first main light emitting unit; and
   a first sub charge generating layer provided in an upper surface of the bank, and
   wherein the first main charge generating layer is separated from the first sub charge generating layer at an end area of the first main light emitting unit.

2. The light emitting display apparatus of claim 1, wherein the end area of the first main light emitting unit protrudes toward an upward direction of the first main light emitting unit.

3. The light emitting display apparatus of claim 1, wherein the first main light emitting unit is separated from another first main light emitting unit provided on the second anode in the second pixel.

4. The light emitting display apparatus of claim 1, wherein the end area of the first main light emitting unit is inclined in an outer direction of the first main light emitting unit.

5. The light emitting display apparatus of claim 1, wherein the additional light emitting layer comprises a second light emitting unit, and the second light emitting unit comprises:

a second main light emitting unit provided on the first main charge generating layer; and a second sub light emitting unit provided on the first sub charge generating layer.

6. The light emitting display apparatus of claim 5, wherein the additional light emitting layer further comprises:

a second charge generating layer provided on the second light emitting unit; and a third light emitting unit provided on the second charge generating layer.

7. The light emitting display apparatus of claim 6, wherein the second charge generating layer is separated at the end area of the first main light emitting unit.

8. The light emitting display apparatus of claim 6, wherein the second charge generating layer comprises:

a second main charge generating layer provided on the second main light emitting unit; and a second sub charge generating layer provided on the second sub light emitting unit.

9. The light emitting display apparatus of claim 8, wherein the second main charge generating layer and the second sub charge generating layer are separated from each other at the end area of the first main light emitting unit.

10. The light emitting display apparatus of claim 8, wherein the third light emitting unit comprises:

a third main light emitting unit provided on the second main charge generating layer; and a third sub light emitting unit provided on the second sub charge generating layer.

11. The light emitting display apparatus of claim 1, wherein the cathode is continuously provided between the first pixel and the second pixel.

12. The light emitting display apparatus of claim 1, wherein white light is output from the first light emitting unit, the first charge generating layer, and the additional light emitting layer.

13. The light emitting display apparatus of claim 1, wherein the additional light emitting layer comprises at least three layers, and at least one of the at least three layers is separated at the end area of the first main light emitting unit.

14. The light emitting display apparatus of claim 5, wherein the second light emitting unit comprises at least three layers, and at least one of the at least three layers is continuously provided at the end area of the first main light emitting unit.

15. The light emitting display apparatus of claim 1, wherein each of at least two charge generating layers included in the additional light emitting layer is separated at the end area of the first main light emitting unit.

16. The light emitting display apparatus of claim 1, wherein one of at least two light emitting units included in the additional light emitting layer is continuously provided at the end area of the first main light emitting unit.

17. The light emitting display apparatus of claim 16, wherein a light emitting unit continuously provided among the at least two light emitting units is provided in an upper end of the additional light emitting layer.

\* \* \* \* \*